(12) United States Patent
Otsuki

(10) Patent No.: US 7,633,122 B2
(45) Date of Patent: Dec. 15, 2009

(54) INSULATED GATE SEMICONDUCTOR DEVICE AND METHOD OF MANUFACTURING THE SAME

(76) Inventor: Masahito Otsuki, c/o Fuji Electric Device Technology Co., Ltd.. 1-11-2 Osaki, Shinagawa-ku, Tokyo, 141-0032 (JP)

( * ) Notice: Subject to any disclaimer, the term of this patent is extended or adjusted under 35 U.S.C. 154(b) by 0 days.

(21) Appl. No.: 11/226,860

(22) Filed: Sep. 14, 2005

(65) Prior Publication Data

US 2006/0163649 A1 Jul. 27, 2006

(30) Foreign Application Priority Data

Jan. 27, 2005 (JP) ............................. 2005-019169

(51) Int. Cl.
*H01L 29/06* (2006.01)
*H01L 29/10* (2006.01)
*H01L 21/336* (2006.01)

(52) U.S. Cl. ...................... 257/331; 257/330; 257/565; 257/E29.027; 257/E29.066; 438/270; 438/272; 438/309

(58) Field of Classification Search ........................ None
See application file for complete search history.

(56) References Cited

U.S. PATENT DOCUMENTS

| 6,005,271 | A | * | 12/1999 | Hshieh | ........................ | 257/341 |
| 6,072,214 | A | * | 6/2000 | Herzer et al. | ................ | 257/331 |
| 6,218,217 | B1 | * | 4/2001 | Uenishi et al. | .............. | 438/138 |
| 6,566,691 | B1 | * | 5/2003 | Inoue et al. | .................. | 257/139 |

(Continued)

FOREIGN PATENT DOCUMENTS

JP          5-243561 A       9/1993

(Continued)

OTHER PUBLICATIONS

Yamaguchi, Masakazu, et al, "IEGT Design Criterion for Reducing EMI Noise," Discrete Semiconductor Division, Semiconductor Company, Toshiba Corporation, Kawasaki, Japan.

(Continued)

*Primary Examiner*—Andy Huynh
*Assistant Examiner*—Hoang-Quan T Ho

(57) ABSTRACT

A trench MOSFET includes mesa regions between the trenches. The mesa regions are connected to an emitter electrode to fix the mesa region potential so that the mesa regions do not form a floating structure. P-type base regions are distributed in the mesa regions, and the distributed p-type base regions (e.g., the limited regions in the mesa regions) are provided with an emitter structure. The trench MOSFET can lower the switching losses, reducing the total losses while suppressing the ON-state voltage drop of the trench IGBT as low as the ON-state voltage drop of the IEGT, and improving the turn-on characteristics thereof. The trench MOSFET also can reduce the capacitance between the gates and the emitter thereof, since the regions where the gate electrode faces the emitter structure are reduced. The trench MOSFET can have trench gate structures set at a narrow interval to relax the electric field localization to the bottom portions of the trenches and obtain a high breakdown voltage. The trench MOSFET narrows the mesa region width between the trenches such that the portions of the n-type layer in the mesa regions extending between the trenches are depleted easily by applying a voltage of around several volts.

11 Claims, 14 Drawing Sheets

U.S. PATENT DOCUMENTS

| | | | |
|---|---|---|---|
| 6,777,743 B2 * | 8/2004 | Hasegawa | 257/329 |
| 2001/0054738 A1 * | 12/2001 | Momota et al. | 257/330 |
| 2003/0160270 A1 * | 8/2003 | Pfirsch et al. | 257/288 |
| 2005/0006700 A1 * | 1/2005 | Cao | 257/328 |
| 2005/0032280 A1 | 2/2005 | Yanagisawa | |

FOREIGN PATENT DOCUMENTS

| | | |
|---|---|---|
| JP | 2000-228519 A | 8/2000 |
| JP | 2001-274400 A | 10/2001 |
| JP | 2001-308327 A | 11/2001 |
| JP | 3410913 B2 | 3/2003 |
| JP | 3545590 B2 | 4/2004 |
| JP | 2006-210547 A | 8/2006 |

OTHER PUBLICATIONS

Related co-pending U.S. Appl. No. 12/122,291; Yuichi Onozawa; "Insulated Gate Semiconductor Device and Method of Manufacturing the Same"; filed May 16, 2008; Spec. pp. 1-22; Figs. 1-13.

Office Action dated Jan. 16, 2009, issued in corresponding Chinese Patent Application No. 200510103685.3, with partial English translation.

Second Office Action Reasons of Rejection issued in corresponding Chinese Patent Application No. 2005101036853 dated Jul. 17, 2009.

* cited by examiner

US 7,633,122 B2

INSULATED GATE SEMICONDUCTOR DEVICE AND METHOD OF MANUFACTURING THE SAME

BACKGROUND

In exploring the developments of electric power converters that exhibit lower electric power consumption, power devices that play a key role in the electric power converters have been expected to exhibit a lower electric power consumption. Among the power devices, insulated gate bipolar transistors (hereinafter referred to as "IGBTs") have been popular because the IGBTs can achieve a low ON-state voltage drop due their conductivity modulation effects and can be driven easily via their gate controlled with a voltage applied thereto. In particular, trench IGBTs, which have a trench structure including trenches formed from the wafer surface and gate electrodes buried in the respective trenches with an oxide film interposed between the gate electrode and the trench wall, are now becoming more popular. Since channels are formed on both sides of each trench, the trench IGBT increases the channel density and lowers the ON-state voltage drop thereof as compared with the so-called planar IGBTs that have gate electrodes on the wafer surface.

Referring to FIG. 14, which show a cross section of a conventional n-channel IGBT cut in perpendicular to the stripe-shaped trenches, p-type base regions 3 are formed in the surface portions of a silicon wafer formed of a heavily doped p-type silicon substrate 1 and a lightly doped n-type drift layer 2. In the surface portions of the p-type base region 3, $n^+$-type emitter regions 4 are selectively formed. A trench is formed from the surface of the $n^+$-type emitter region 4 down to the n-type drift layer 2, through the p-type base region 3. A polysilicon gate electrode 6 is formed in the trench with a gate oxide film 5 interposed between the gate electrode 6 and the trench wall. An interlayer insulator film 7 is formed to cover the upper portion of gate electrode 6. A sheet shaped emitter electrode 8 is formed on the interlayer insulator film 7 such that the emitter electrode 8 is in contact commonly with the $n^+$-type emitter regions 4 and the p-type base regions 3. Although a passivation film, such as a nitride film and an amorphous silicon film, can be formed on the emitter electrode 8, the passivation film is not shown in FIG. 14. A collector electrode 9 is formed on the back surface of the p-type silicon substrate 1.

The trench IGBT is brought into its ON-state as follows. The IGBT is in the OFF-state thereof when the voltage of the gate electrode 6 is lower than the threshold value in the ON-state. The emitter electrode 8 is typically grounded and a voltage higher than the voltage of the emitter electrode 8 is applied to the collector electrode 9. As a voltage higher than the threshold value is applied from a gate driver circuit to the gate electrode 6 through a gate resistance, electric charges start accumulating in the gate electrode 6. Simultaneously with the charge accumulation in the gate electrode 6, the portion of the p-type base region 3 facing the gate electrode 6 via the gate oxide film 5 is inverted to an n-type to form a channel region. As the channel regions are formed, electrons are injected from the emitter electrode 8 to the n-type drift layer 2 via the $n^+$-type emitter regions 4 and the p-type base regions 3. The injected electrons bias the p-type silicon substrate 1 and the n-type drift layer 2 forwardly and holes are injected from the collector electrode 9, resulting in an ON-state of the IGBT. The voltage drop between the emitter electrode 8 and the collector electrode 9 is the ON-state voltage drop.

To bring the IGBT from the ON-state to the OFF state, the electric charges accumulated in the gate electrode 6 are discharged via the gate resistance to the gate diver circuit by setting the voltage between the emitter electrode 8 and the gate electrode 6 to be lower than the threshold value. As the electric charges accumulated in the gate electrode 6 are discharged, the channel regions inverted to the n-type return to the p-type. Since the channel regions vanish, the electron supply is stopped. Since the hole supply is also stopped, the electrons and the holes accumulated in the n-type drift layer 2 are ejected to the collector electrode 9 and the emitter electrode 8 respectively, or the current vanishes due to the recombination of the electrons and the holes, bringing the IGBT into the OFF-state thereof.

Various improvements have been proposed to further reduce the ON-state voltage drop of the trench IGBT. The injection enhanced gate bipolar transistor (hereinafter referred to as the "IEGT") disclosed in the Japanese patent publication JP P Hei. 5 (1993)-243561 A exhibits the ultimate characteristics close to the ON-state voltage drop of the diode. The IEGT covers part of the surfaces of the $n^+$-type emitter regions and the p-type base regions with an insulator film so that the covered regions and the emitter electrode do not contact each other. Although the operation of the IEGT is fundamentally the same as that of the trench IGBT, the holes, below the p-type base region in the portion where the $n^+$-type emitter regions and the p-type base region are not in contact with the emitter electrode, are hardly ejected to the emitter electrode. The holes, being hardly ejected to the emitter electrode, accumulate and the carrier concentration distributions in the n-type drift layer becomes close to the carrier concentration distributions in the diode. Therefore, the IEGT can reduce the ON-state voltage drop thereof lower than the ON-state voltage drop of the typical trench IGBT. However, the power devices also need to exhibit a high-speed switching performance in addition to the low ON-state voltage drop. Therefore, it is also important to improve the high-speed switching performance of the power devices. But large capacitance is formed between the gate electrodes and the emitter electrode in the trench IGBT and the IEGT, since trench structures are formed very densely in the trench IGBT and the IEGT.

As described above in connection with the operations of the IGBT shown in FIG. 14, it is necessary to charge and discharge to the capacitance between the gate electrodes and the emitter electrode in the transition from the ON-state to the OFF-state and vice versa. When the capacitance between the gate electrodes and the emitter electrode is large, the period for charging and discharging increases. The losses in the power device include the steady state losses determined by the ON-state voltage drop and the switching losses caused by the ON-OFF operations. Therefore, it is important to reduce the capacitance between the gate electrodes and the emitter electrode that causes the switching losses.

A structure similar to that shown in FIG. 14 is disclosed in JP P 2001-308327 A. By disposing a region 11 covered with the insulator film 7 and not in contact with the emitter electrode 8, the holes, which hardly eject to the emitter electrode 8, become accumulated in the region 11 so that the carrier concentration distributions in the n-type drift layer can be close to the carrier concentration distributions in the diode. Moreover, since no trench gate structure covered with the insulator film 7 and not working for a control electrode, is formed in the region 11, the capacitance between the gate electrodes and the emitter electrode is reduced, the charging period and the discharging period are shortened, and the switching losses are reduced.

The structure disclosed in JP P 2001-308327 A, however, includes a floating mesa region 11. As described in Yamaguchi, et. al., "IEGT Design Criterion for Reducing EMI Noise", in Proc. ISPSD' 2004, pp. 115-119, (2004), commonly on the structures disclosed in the above identified Japanese patent publications, there still remains room for improving the turn-on characteristics of the structures thereof.

It is essentially difficult for the structure shown in FIG. 14 to obtain a high breakdown voltage. Since the trenches are arranged at unequal intervals, the electric field is distributed unevenly and liable to localize to the bottom potions of the trench gates. In view of the foregoing, it would be desirable to provide an insulated gate semiconductor device that can suppress the ON-state voltage drop of the trench IGBT as low as the ON-state voltage drop of the IEGT, while reducing the switching losses, reducing the total losses, improving the turn-on characteristics, and obtaining a high breakdown voltage. The present invention addresses this need.

SUMMARY OF THE INVENTION

The present invention relates to insulated gate semiconductor devices for electric power converters and such semiconductor apparatuses. The present invention also relates to a method of manufacturing such insulated gate semiconductor devices.

One aspect of the present invention relates to an insulated gate semiconductor device that can include a first semiconductor layer of a first conductivity type, a second semiconductor layer of a second conductivity type on the first semiconductor layer, stripe-shaped or longitudinally extending trenches formed in the surface portions of the second semiconductor layer, third semiconductor regions of the first conductivity type between the trenches, the third semiconductor regions being selectively formed in the longitudinal direction of the trenches, at least one fourth semiconductor region of the second conductivity type selectively formed in at least one surface portion of the third semiconductor region, a gate electrode in the trench with an insulator film interposed between the gate electrode and the trench, an emitter electrode in contact with the third semiconductor regions and the fourth semiconductor region, and a collector electrode in contact with the first semiconductor layer.

Portions of the second semiconductor layer extending between the adjacent trenches are covered with an insulator layer between the adjacent third semiconductor regions. The third semiconductor regions and the fourth semiconductor region(s) can be connected electrically to each other through the common portions of the emitter electrode. The third semiconductor regions can be aligned diagonally to the trenches such that a checkered pattern is formed. The trenches can be arranged at an equal interval and the width W of the regions sandwiched between the trenches can satisfy the following condition $W<0.186V^{1/2}$, where V represents the rated voltage of the insulated gate semiconductor device. The ratio of the sum of the surface areas of the third semiconductor regions and the fourth semiconductor region to the surface area of the first semiconductor layer can be 80% or lower and 10% or higher, namely between 10-80%.

Another aspect of the present invention is a method of manufacturing the above described semiconductor device. The method can include the providing the semiconductor substrate and the second semiconductor layer on the first semiconductor layer, forming the stripe-shaped trenches in the surface portions of the second semiconductor layer, selectively forming the third semiconductor regions between the trenches in the longitudinal direction of the trenches, selectively forming the at least one fourth semiconductor region in at least one surface portion of the third semiconductor regions, forming the gate electrode in each of the trenches with the insulator film interposed-between the gate electrode and the respective trench, forming the emitter electrode in contact with the third semiconductor regions and the fourth semiconductor region(s), and forming the collector electrode in contact with the first semiconductor layer.

The method can include forming selectively forming the third and fourth semiconductor regions using impurity diffusions, such that the diffusion layers of the third semiconductor regions and the fourth semiconductor regions do not cross the trenches.

DETAILED DESCRIPTION

To obviate the problems described above, the surface structure for a vertical IGBT is provided with the following three specific features. First, for improving the turn-on characteristics, the mesa region potential is fixed by connecting the mesa regions sandwiched between the trenches to the emitter electrode so that the mesa regions is not floating. Note that the mesa region corresponds to the p-type base region between the trenches or the portion of the n-type drift layer extending between the trenches. The Yamaguchi publication describes that the floating mesa region potential varies the gate potential in the turn-on process, destabilizing the turn-on operations of the IGBT and impairing the controllability of the IGBT. Therefore, the turn-on characteristics can be improved essentially by removing the floating regions. If the floating regions, however, are simply eliminated, the structure will return to the typical trench IGBT, loosing the IE effects and increasing the ON-state voltage drop. Therefore, the floating region removal technique cannot be solely employed. It is necessary to employ the floating region removal together with additional measures so as not to loose the IE effects.

Second, for reducing the switching losses while the ON-state voltage drop of the trench IGBT is kept as low as the ON-state voltage drop of the IEGT and the total losses are reduced, by distributing the p-type base regions in the mesa region between the trenches and by providing the p-type base regions distributed in the mesa region (i.e., some limited regions in the mesa region) with an emitter structure so as not to loose the IE effects. Since the regions, where the gate electrode is facing the emitter structure, are reduced, the capacitance between the gate electrodes and the emitter electrode is reduced. If the distribution of the p-type base regions in the mesa region and the provision of the emitter structure to the distributed p-type base regions are combined simply with the floating region removal, the electric field distributions become uneven between the p-type base regions and in the trench gate bottoms, impairing the breakdown voltage of the device and the reliability of the trench gates. Therefore, it is also desirable to make the electric field distributions uniform.

Third, the electric field localization to the trench gate bottoms is relaxed by appropriately arranging the trench gate structures at a narrow interval. In other words, the mesa region width between the trenches is narrowed so that the portions of the n-type drift layer extending into the mesa regions between the trenches can be depleted easily by applying a voltage of several volts. By appropriately arranging the trench gate structures at a narrow interval, the electric field distributions near the device surface in the OFF-state of the device can be made uniform, and in particular, the capacitance between the gate electrodes and the collector electrode can be reduced.

Figure 1:
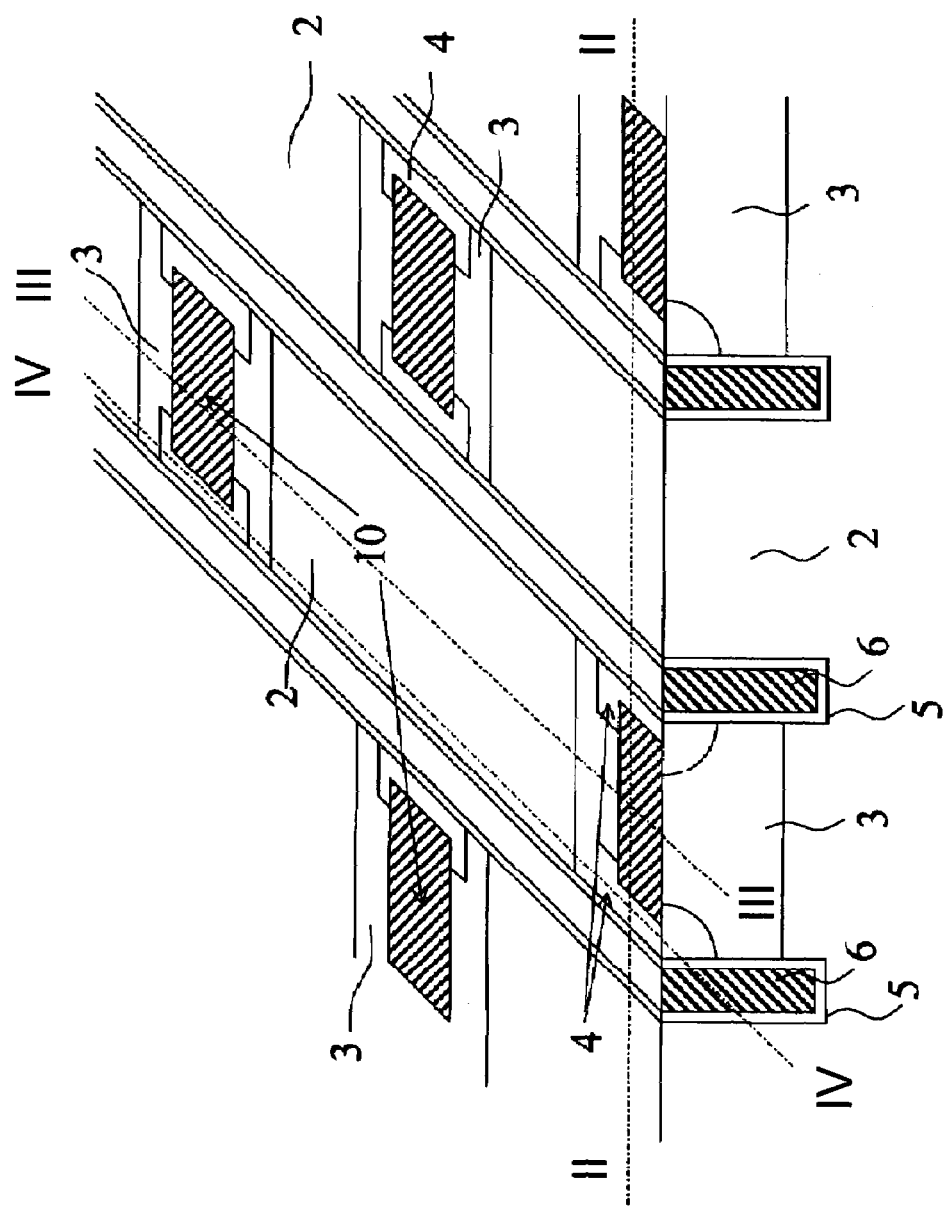
FIG. 1 schematically illustrates a perspective view of a first embodiment of an n-channel IGBT according to the present invention.
Figure 2:
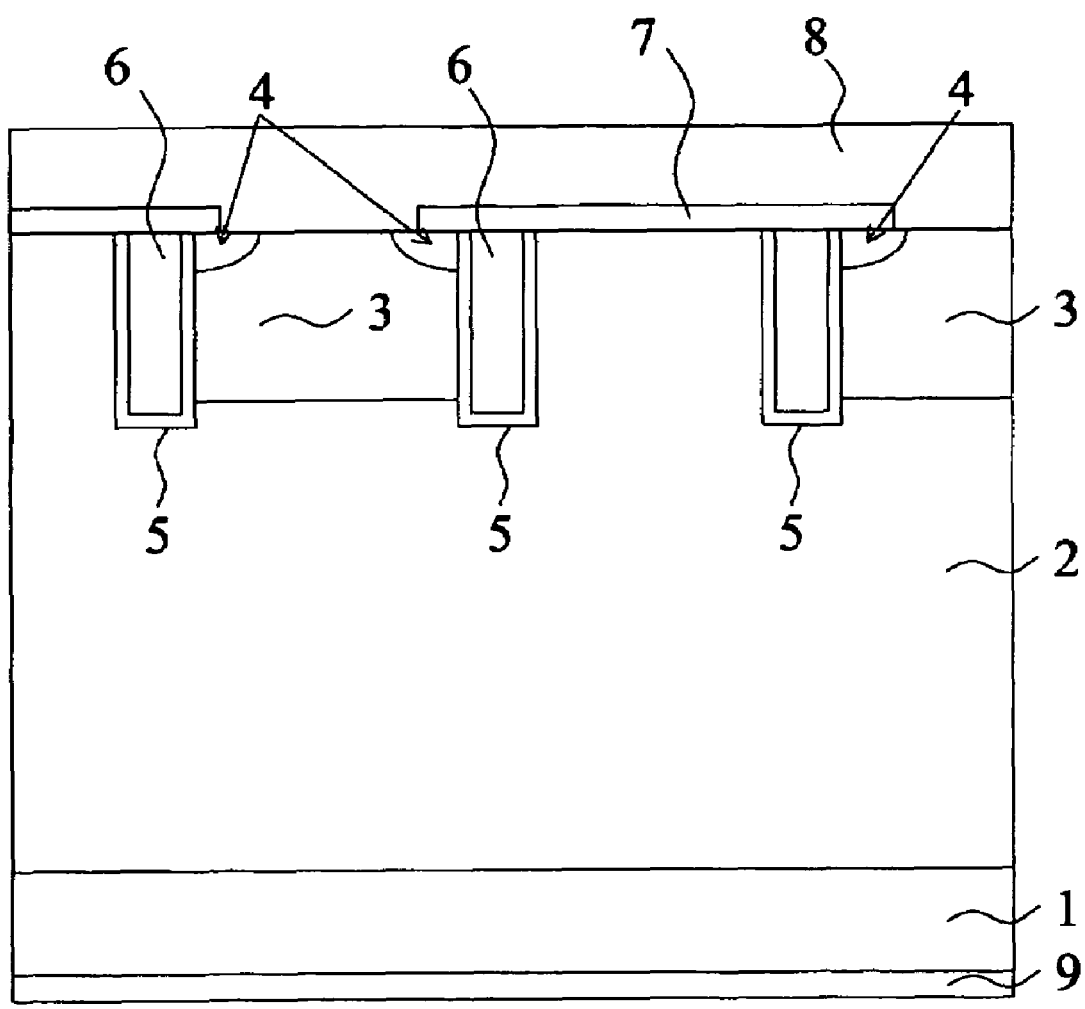
FIG. 2 is a cross sectional view taken along line segment II-II of FIG. 1.

FIGS. 1-4 show the active region of the n-channel IGBT of the first embodiment. FIG. 1 depicts a cross section perpendicular to the stripe-shape trench gates of the n-channel IGBT. Although an edge termination including a guard ring, a field plate, a RESURF structure and the like can be typically arranged in the circumference region of the semiconductor chip, the edge termination is not illustrated in the accompanied drawings.

Referring to FIGS. 1-4, p-type base regions 3 are selectively formed in the surface portions of a silicon wafer formed of a heavily doped p-type silicon substrate 1 and a lightly doped n-type drift layer 2. In the surface portions of the p-type base region 3, n$^+$-type emitter regions 4 are selectively formed. In the first embodiment, the p-type base regions 3 are distributed such that the p-type base regions 3 and (extending) portions of the lightly doped n-type drift layers 2 are exposed alternately to the mesa surface in the longitudinal direction of the trench. In the direction perpendicular to the trenches, the p-type base regions 3 and the extending portions of n-type drift layers 2 are also arranged alternately with a trench interposed between the p-type base region 3 and the extending portion of the n-type drift layer 2. Over the entire active region, the p-type base regions 3 can be arranged in a checkered pattern. By arranging the p-type base regions 3 in a checkered pattern, the p-type base regions 3 can be arranged uniformly. By arranging the p-type base regions 3 uniformly, the electric field is distributed uniformly to prevent lowering of the breakdown voltage of the device.

A polysilicon gate electrode 6 working as a control electrode is in the trench with a gate oxide film 5 interposed between the gate electrode 6 and the trench wall. An interlayer insulator film 7 is formed on the gate electrode 6 and on the extending portion of the n-type drift layer 2 extending to the mesa surface between the p-type base regions 3. An emitter electrode 8 is formed over the interlayer insulator films 7 such that the emitter electrode 8 is in contact commonly with the n$^+$-type emitter regions 4 and the p-type base regions 3. A passivation film (not illustrated), such as a nitride film and a polyimide film, can be formed on the emitter electrode 8. A collector electrode 9 is formed on the back surface of p-type silicon substrate.

Figure 3:
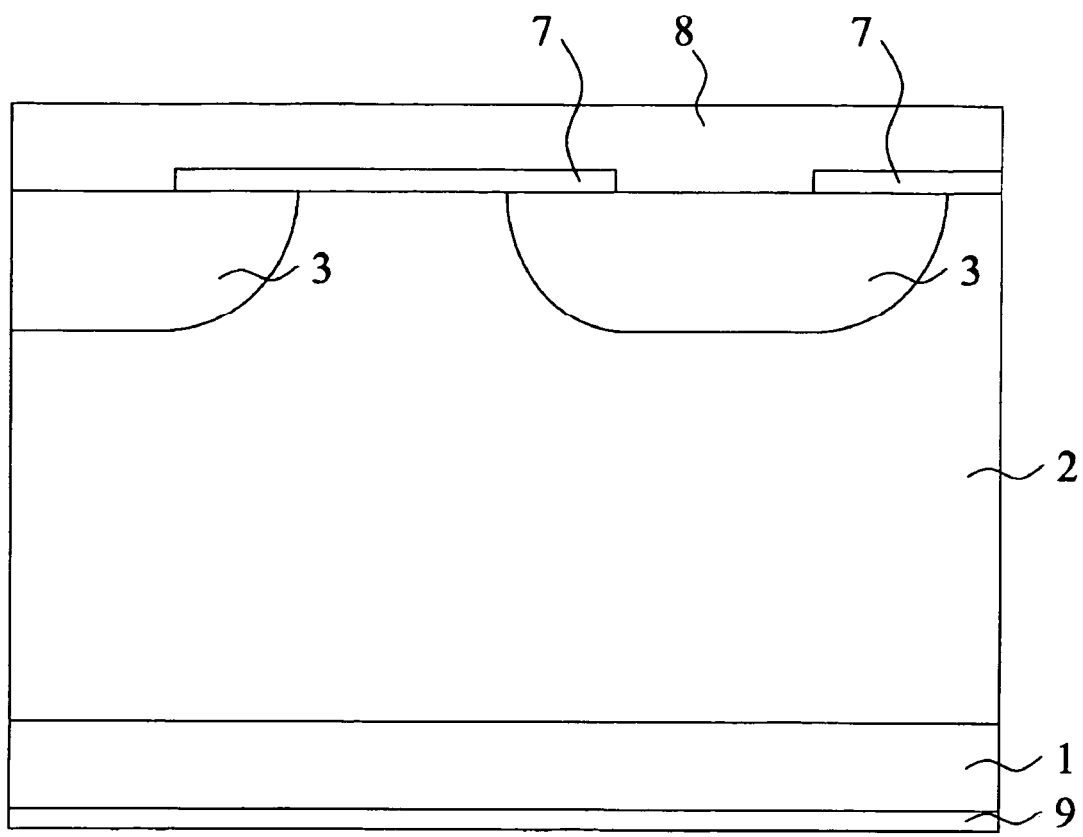
FIG. 3 is a cross sectional view taken along line segment III-III of FIG. 1.
Figure 4:
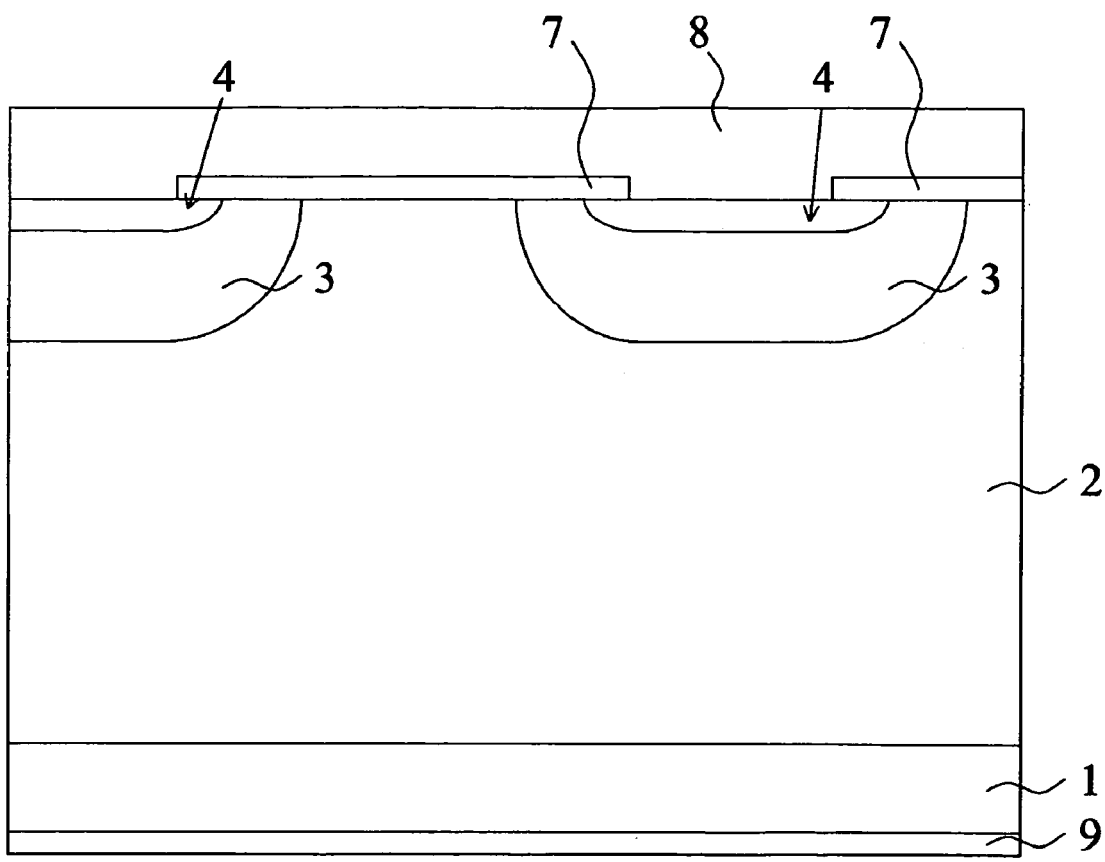
FIG. 4 is a cross sectional view taken along line segment IV-IV of FIG. 1.

Since the p-type base regions 3 are distributed between the trenches, the p-type base regions 3 diffuse laterally in the longitudinal direction of the trenches as shown in FIG. 3. Since the n$^+$-type emitter regions 4 are formed only on the side walls of the trenches, the n$^+$-type emitter regions 4 appear not in FIG. 3 but in FIG. 4. The emitter electrode 8 is in contact commonly with the n$^+$-type emitter regions 4 and the p-type base region 3 in an emitter contact region 10.

Figure 5A:
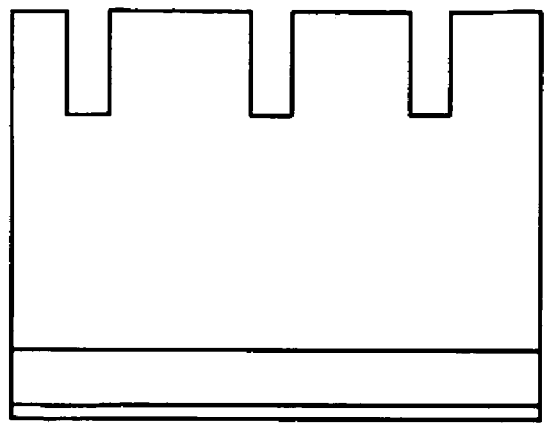
FIGS. 5A-5C schematically illustrate the steps of forming trenches, forming gate oxide films on the trench walls, and forming gate electrodes in the respective trenches.
Figure 5B:
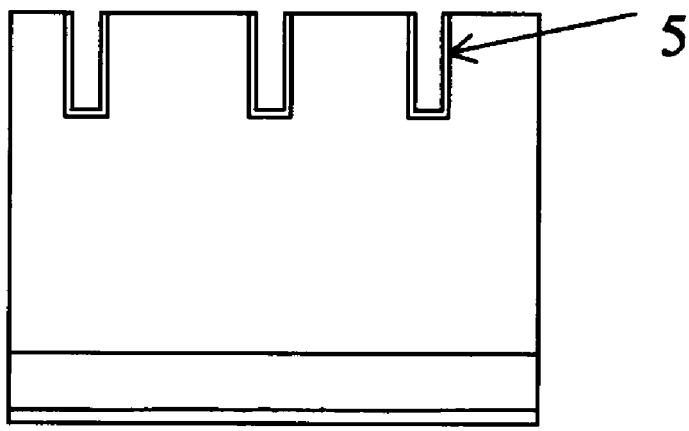
Figure 5C:
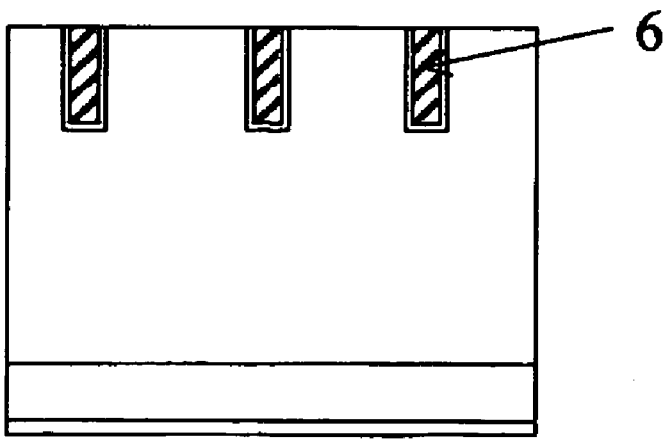
Figure 6A:
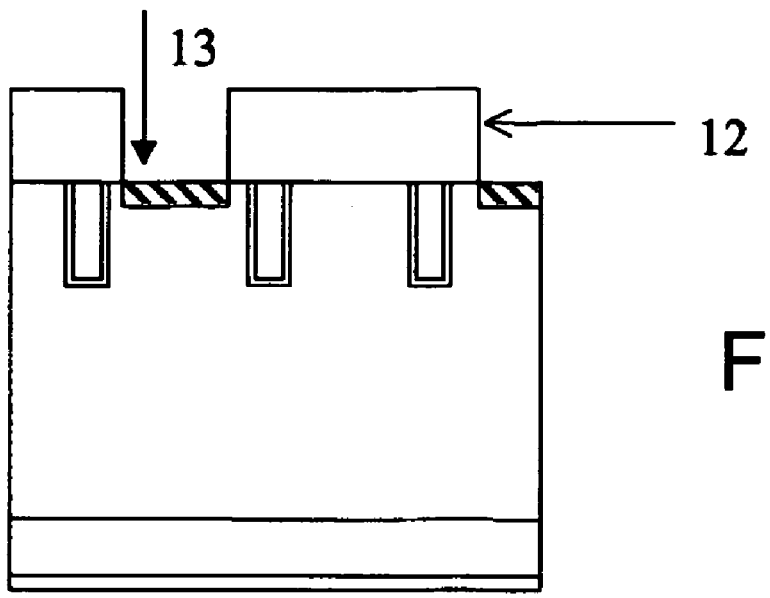
FIGS. 6A-6C schematically illustrate the steps of injecting boron ions, forming p-type base regions, and forming $n^+$-type emitter regions.
Figure 6B:
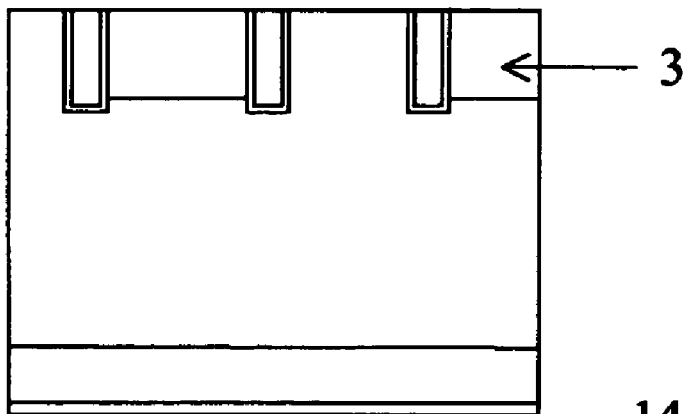
Figure 6C:
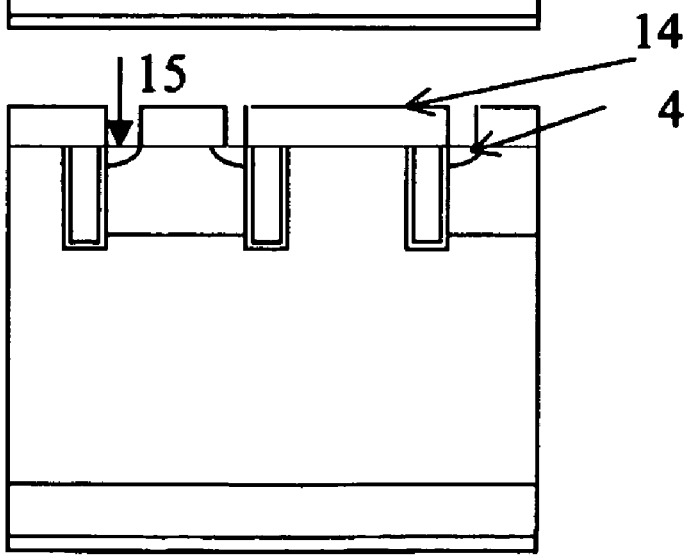
Figure 7A:
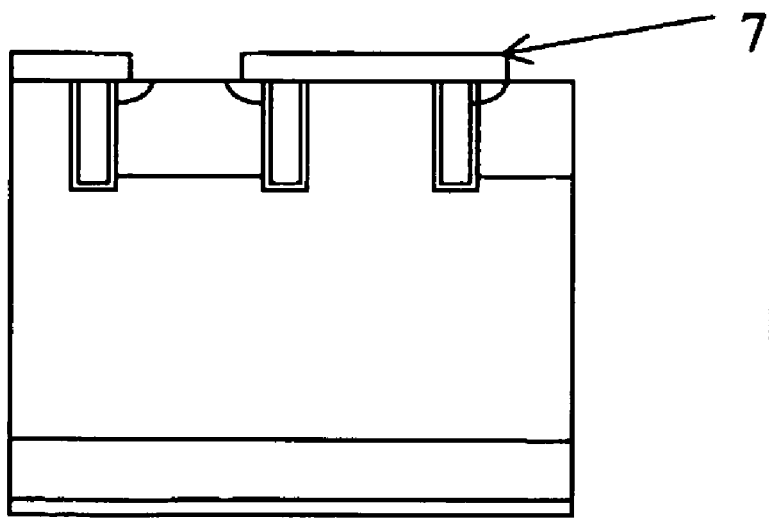
FIGS. 7A-7B schematically illustrate the steps of forming interlayer insulator films and forming an emitter electrode.
Figure 7B:
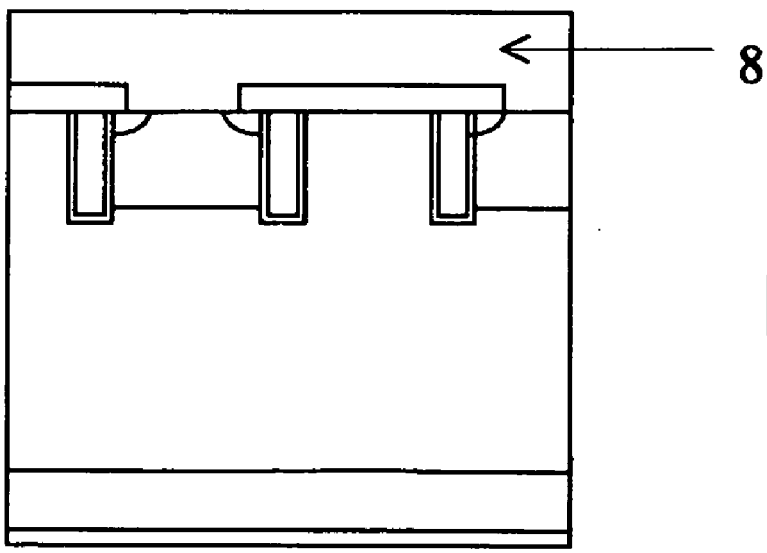

Now the steps for manufacturing the first embodiment exhibiting a breakdown voltage of the 1200 V class will be described below with reference to FIGS. 5A-7B. First, a silicon wafer, the resistivity thereof is from 60 to 80 Ωcm, is obtained. Trenches are formed by etching the silicon wafer for the depth of around 5 μm using the anisotropic etching technique (FIG. 5A). A gate oxide film 5 of around 100 nm in thickness is formed in the trench by thermal oxidation (FIG. 5B). Then, polysilicon is deposited in the trench by the CVD method to form a gate electrode 6 in the trench (FIG. 5C). After forming the trench gates as described above, boron ions 13 are implanted using a patterned photoresist film(s) 12 as a mask to form the distributed p-type base diffusion layers 3 (FIG. 6A). To set the junction depth of the p-type base diffusion layers 3 around 4 μm, the implanted boron atoms are diffused by driving at a high temperature of around 1100° C. for several hours. Since the trench gates have been formed already, the gate oxide films prevent impurity diffusion across the trench gates. Therefore, the p-type base diffusion layers 3 diffuse laterally only parallel to the trenches (in the longitudinal direction of the trenches). The regions between the trenches, into which no boron ion is injected, remain the n-type (FIG. 6B). Then, photoresist films 12 are removed. Arsenic ions 15 are implanted using a patterned photoresist film(s) 14 as a mask. Then, the n$^+$-type emitter regions 4 are formed by annealing at around 1000° C. (FIG. 6C). Then, the photoresist film 14 is removed and SiO$_2$ is deposited by the CVD method to form the interlayer insulator films 7 of around 1 μm in thickness (FIG. 7A). Then, contacts are formed through the interlayer insulator films 7 using a photoresist pattern and the emitter electrode 8 is formed by depositing Al or similar conductive electrode material (FIG. 7B).

Figure 8:
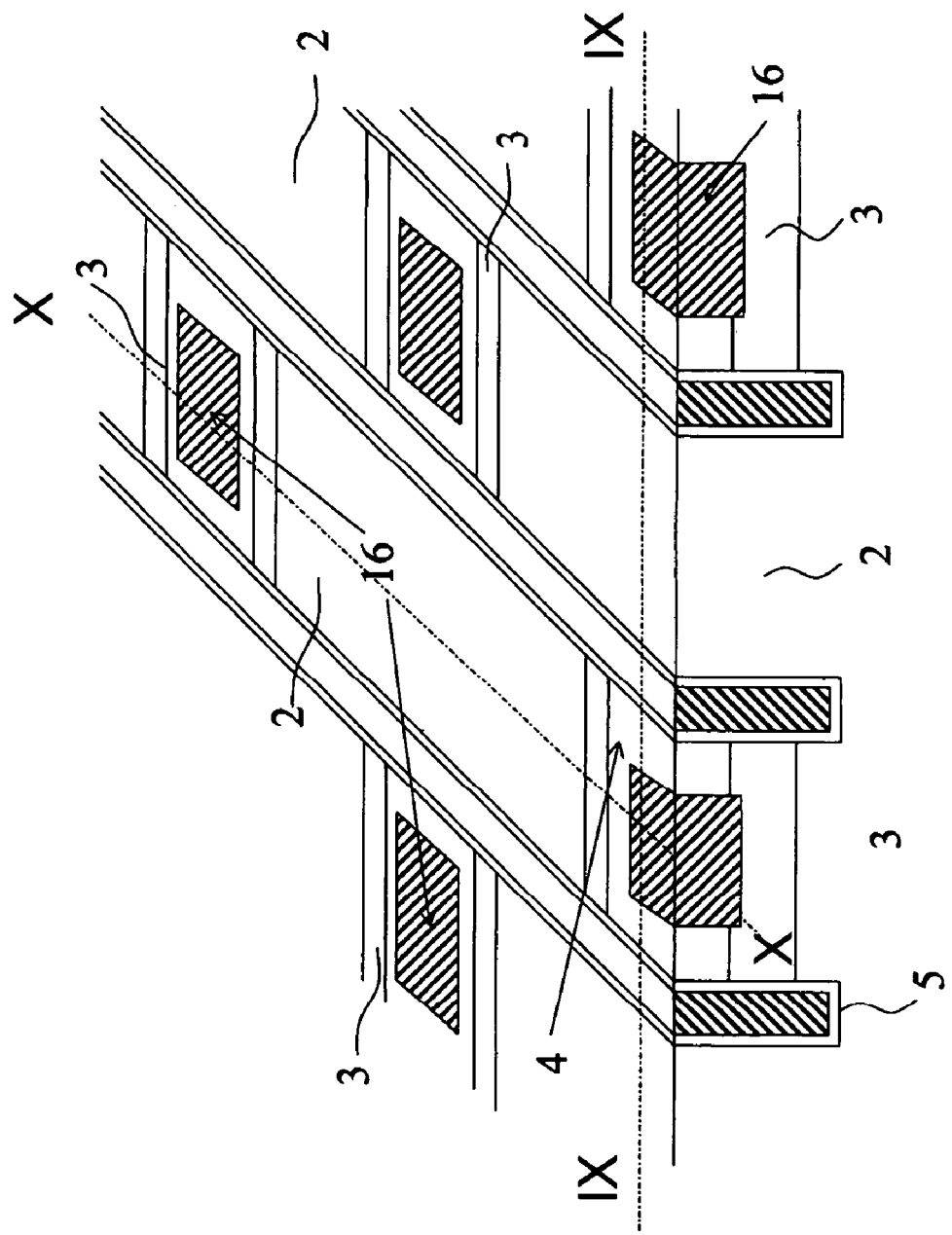
FIG. 8 schematically illustrates a perspective view of a second embodiment of an n-channel IGBT according to the present invention.
Figure 9:
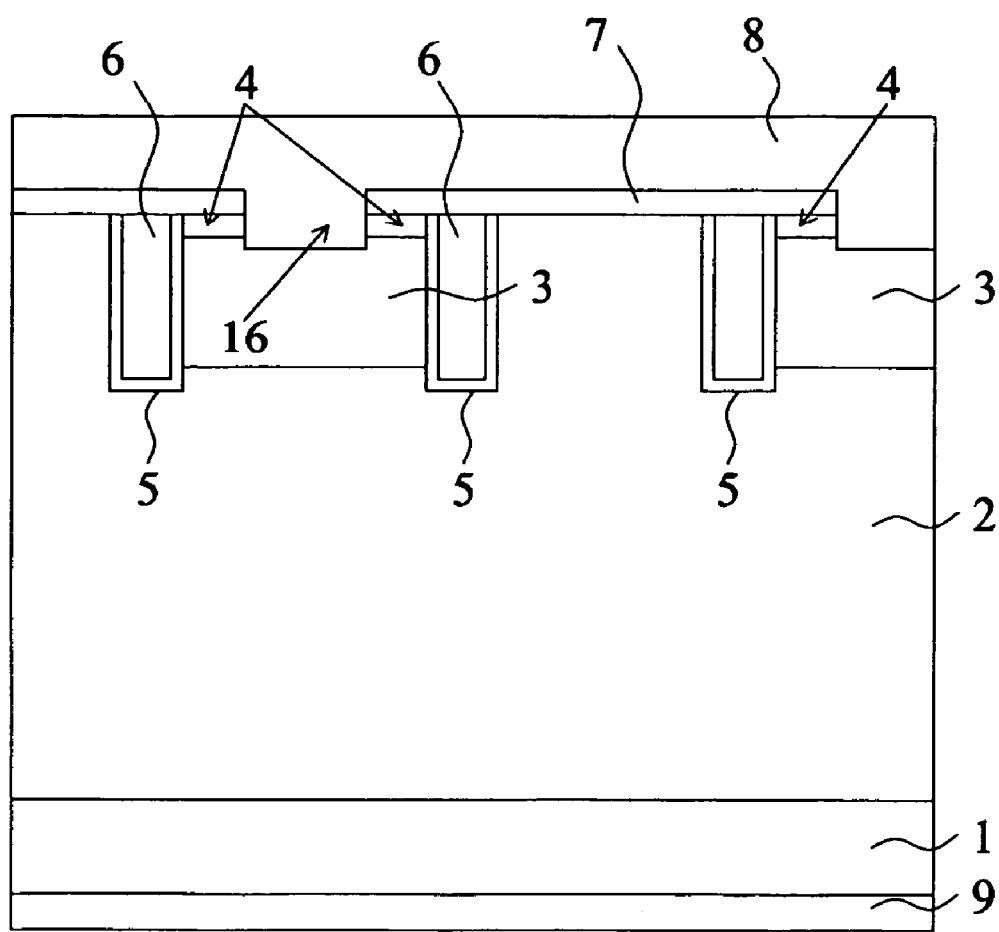
FIG. 9 is a cross sectional view taken along line segment IX-IX of FIG. 8.
Figure 10:
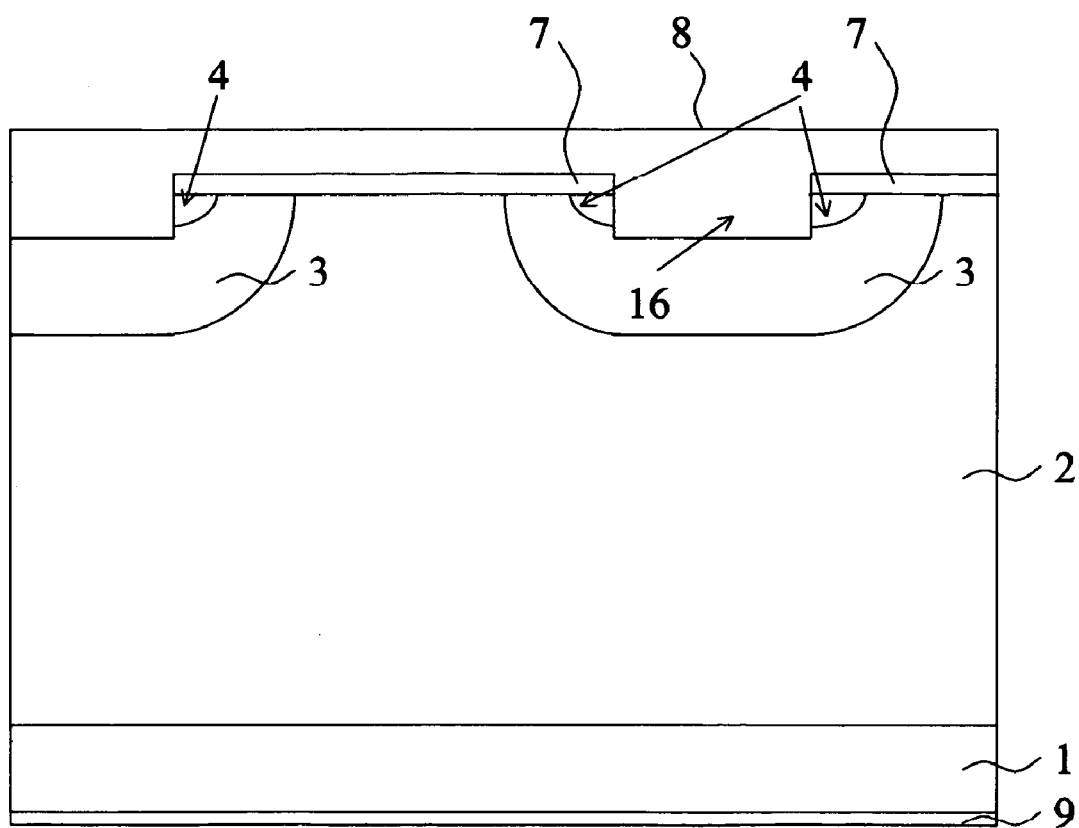
FIG. 10 is a cross sectional view taken along line segment X-X of FIG. 8.

FIGS. 8-10 show the active region of the n-channel IGBT according to the second embodiment. Referring to these figures, the second embodiment is different from the first embodiment in the shape of the n$^+$-type emitter region 4 and the contact of emitter electrode 8. In the first embodiment, the n$^+$-type emitter regions 4 are arranged locally along the trench side walls. In the second embodiment, the n$^+$-type emitter region 4 is formed in the p-type base region 3 and extends between the adjacent trenches. An emitter trench is formed through the n$^+$-type emitter region 4 and an emitter contact region 16 is formed in the emitter trench such that the emitter electrode 8 is in contact commonly with the n$^+$-type emitter region 4 and the p-type base region 3 in the emitter trench. Although the formation of the emitter trenches for emitter contacts 16 causes additional manufacturing steps, electrical contact is securely and easily realized.

Figure 11:
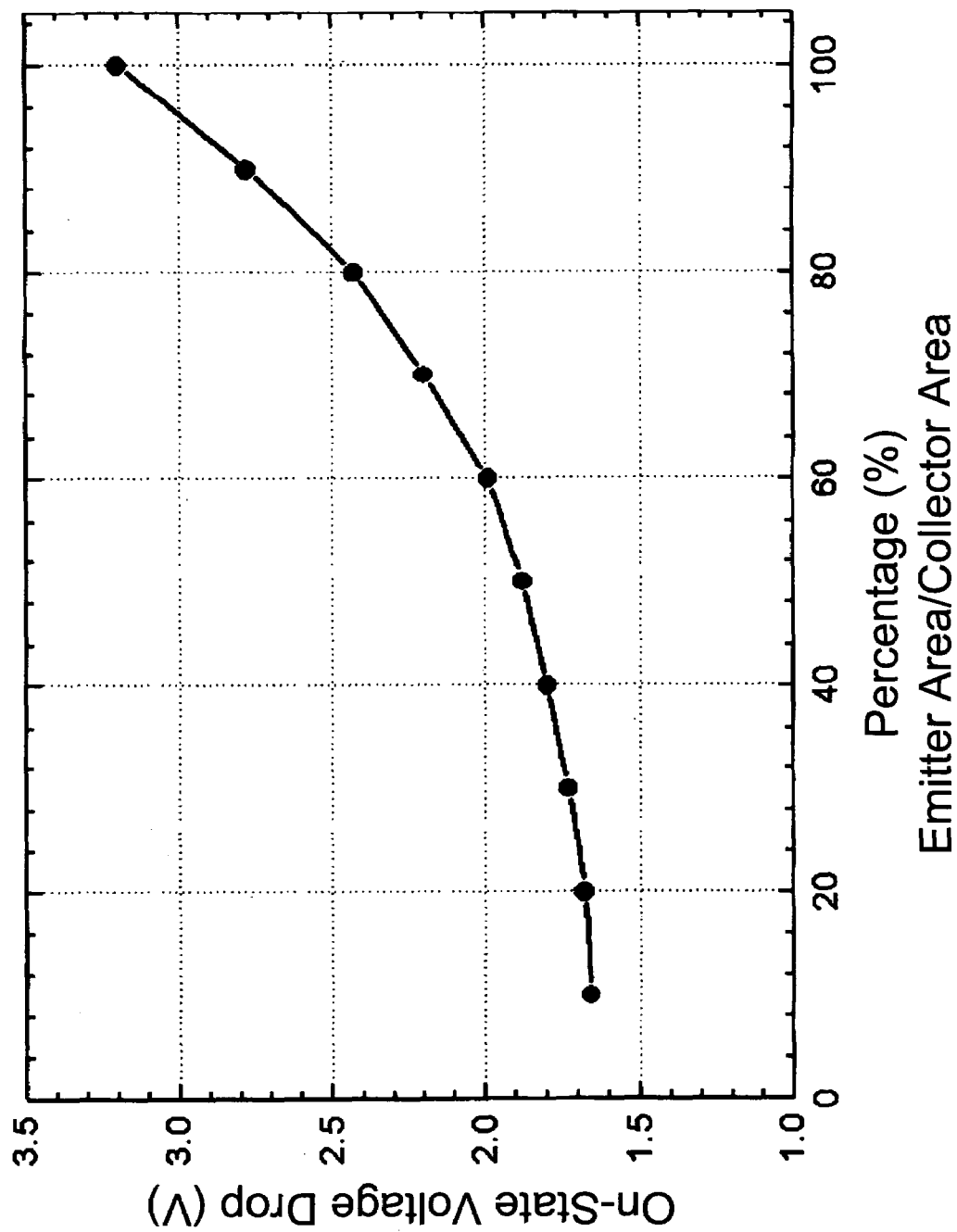
FIG. 11 is a curve illustrating the characteristics change caused by changing the mesa width in the structure shown in FIG. 1 and estimated by a device simulation technique.

FIG. 11 is a curve illustrating the characteristics change caused by changing the mesa width in the structure shown in FIG. 1 and estimated by the device simulation technique. In FIG. 11, the horizontal axis represents the ratio of the emitter area to the collector area and the vertical axis represents the ON-state voltage drop at the room temperature and at the current density of 120 A/cm$^2$. In the first embodiment, the emitter area is the total area of the p-type base regions 3 (including the areas of the n$^+$-type emitter regions 4). As FIG. 11 shows clearly, the ON-state voltage drop reduces as the emitter area ratio reduces. At present, IGBTs with the ON-state voltage drop higher than 2.5 V is not deemed suitable for low-loss switching in general motor driver circuits, since the ON-state voltage drop higher than 2.5 V causes large losses. From the view point described above, it is desirable for the emitter area ratio to be 80% or lower. When the emitter area ratio is lower than 10%, the breakdown withstanding capability of the device can be impaired. In the same manner as described in connection with the IGBT, the rated current density of the IGBTs applied to the general motor driver circuits can be from 100 to 150 A/cm$^2$. Although the rated current density is set at 120 A/cm$^2$ in the estimation, this current density is the one at the collector electrode. When the emitter area ratio is 10%, the current density at the emitter electrode reaches 1200 A/cm$^2$. Usually, it is required for the IGBTs to operate at the current density twice as high as the rated current density. When the IGBT is operating at the current density twice as high as the rated current density, the current density on the emitter electrode side is 2400 A/cm$^2$. When the current density on the emitter electrode side is as high as 2400 A/cm$^2$, the breakdown of the device called "latch-up", in which a parasitic thyristor works, can result. Therefore, for securing a certain latch-up-breakdown withstanding capability, it is desirable for the emitter area ratio to be at least 10% or higher.

Figure 12:
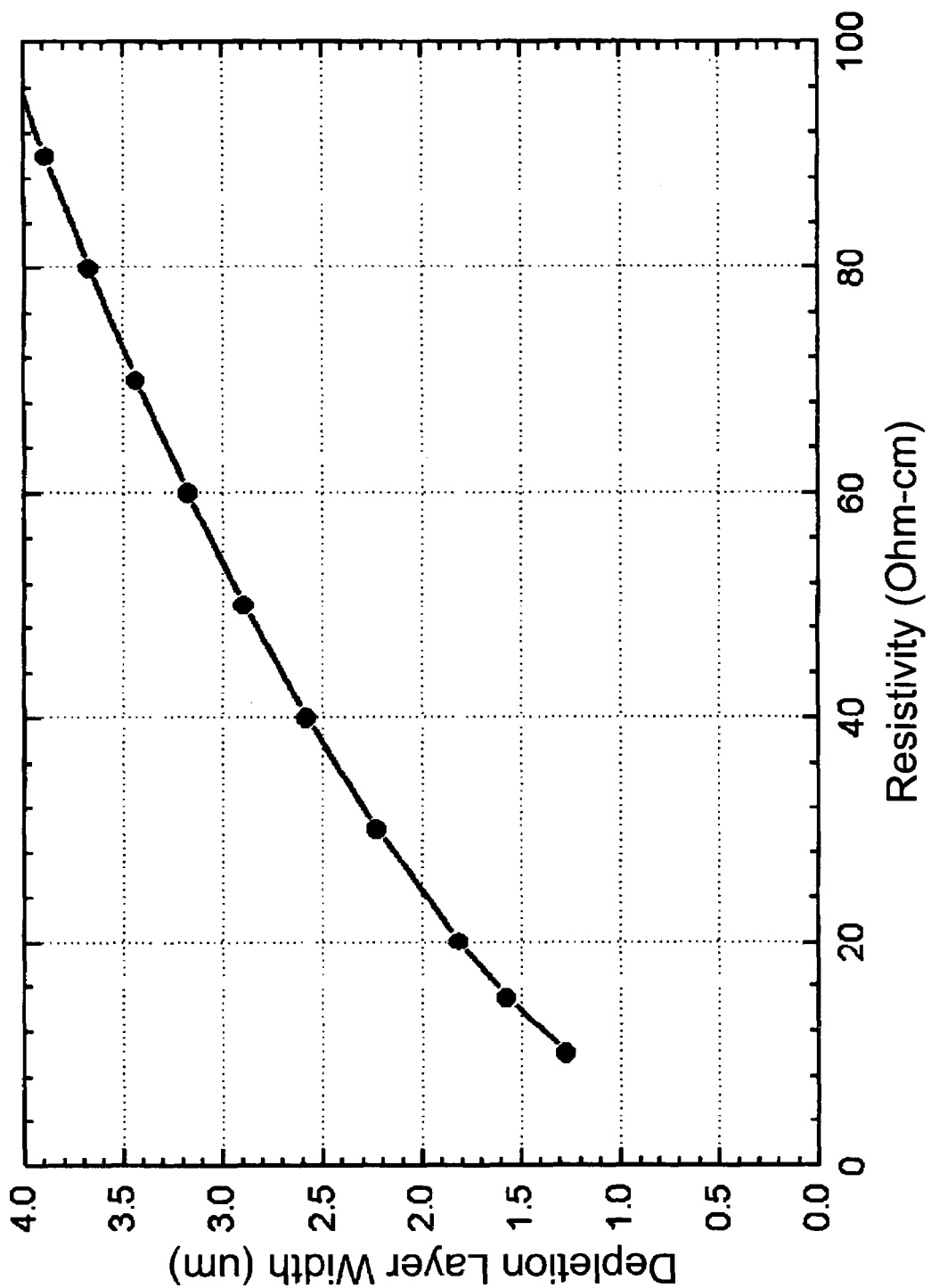
FIG. 12 is a calculated curve relating the mesa region resistivity under the applied voltage of 0.6 V in relation with the depletion layer width.

Now the relations between the mesa region width between the trenches and the characteristics will be investigated below. In the IGBT structure according to the invention, a high breakdown voltage is obtained due to the uniform electric field distribution realized by the depletion of the mesa regions. In other words, for obtaining a high breakdown voltage, it is necessary to prevent any depletion layer from entering the mesa regions, which are sandwiched between the trenches. It is desirable for the mesa regions to be depleted with a slight potential. FIG. 12 is a calculated curve relating the mesa region resistivity under the applied voltage of 0.6 V with the depletion layer width. The depletion layer width W in the one-sided abrupt junction when a certain potential φ is applied to certain resistance ρ is theoretically approximated easily by the following equation (1):

$$W=((2\epsilon_s/q\rho)\cdot(\phi-2kT/q))^{1/2} \quad (1)$$

Figure 13:
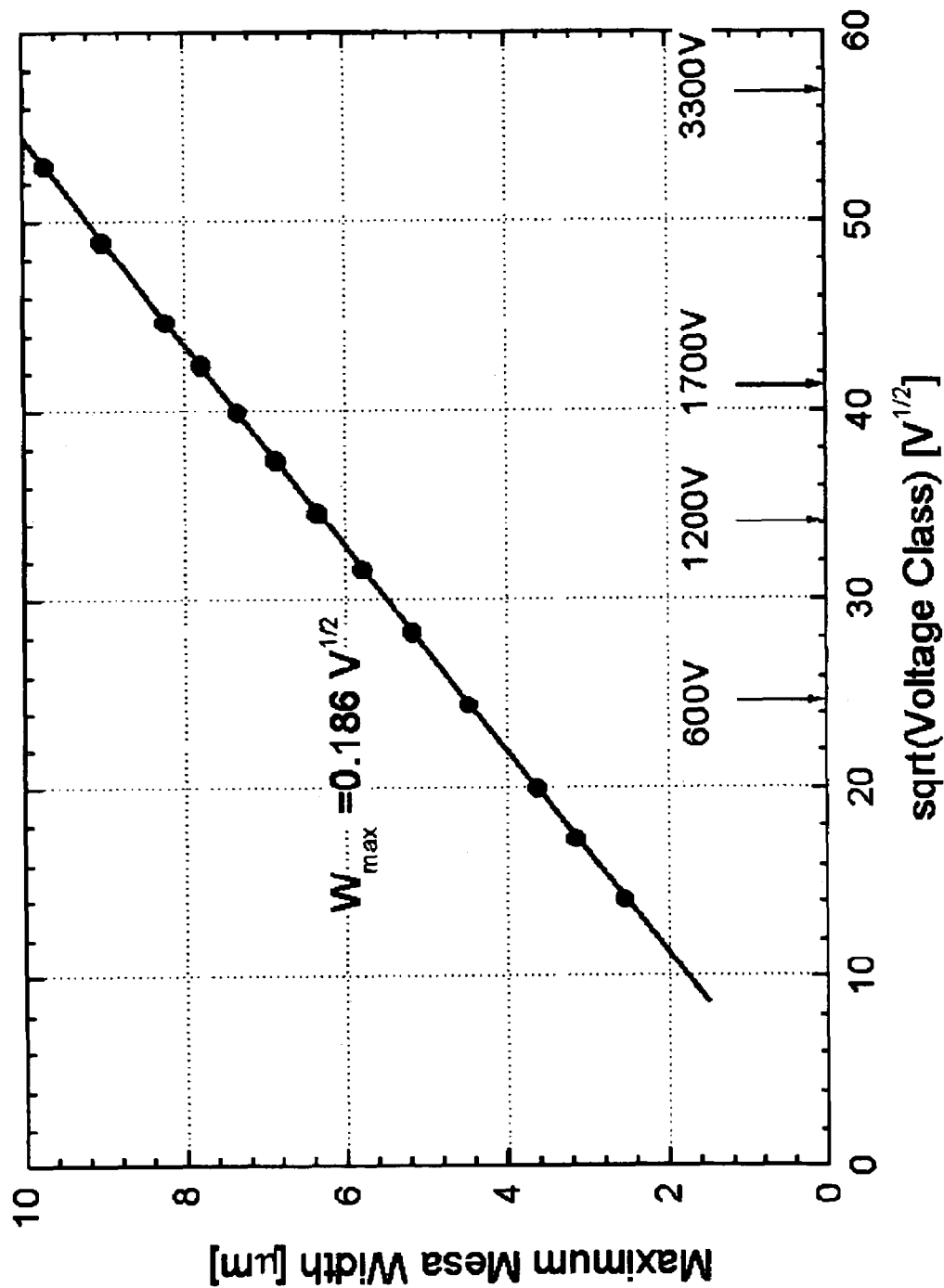
FIG. 13 is a line relating the maximum mesa width with the square root of the breakdown voltage class.
Figure 14:
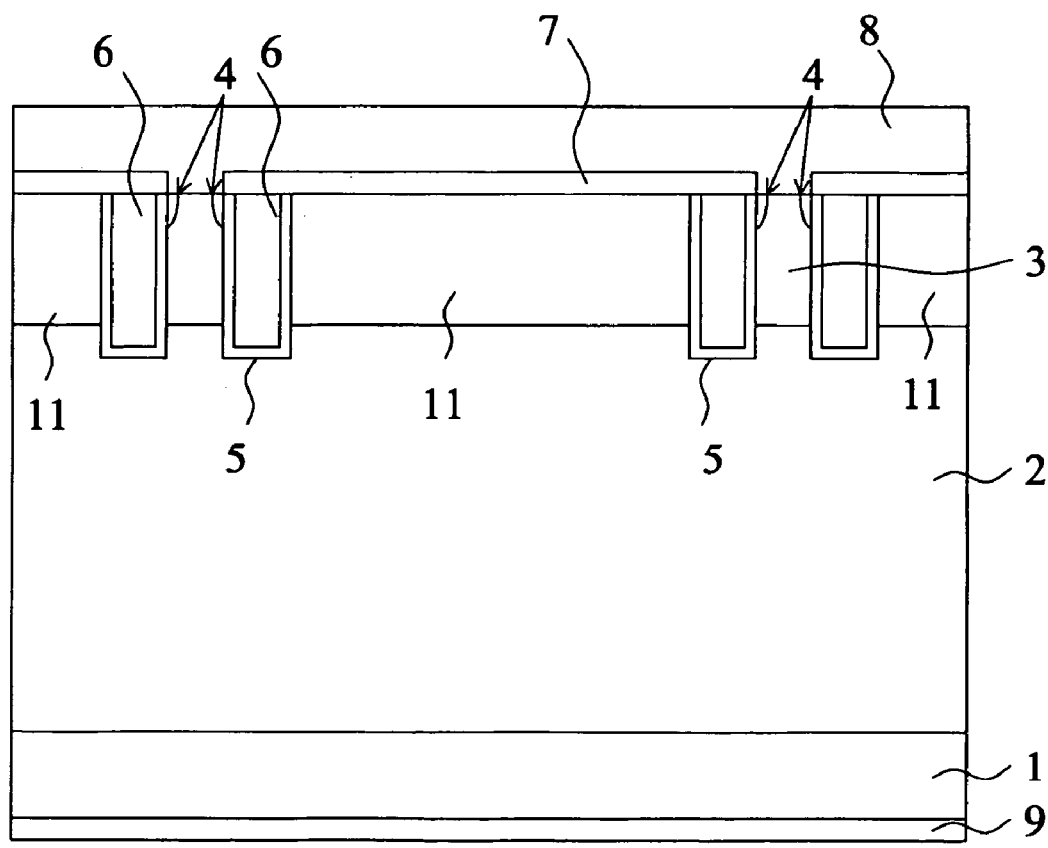
FIG. 14 is a cross sectional view of a conventional n-channel trench IGBT.

When the relation expressed by the equation (1) is employed, the depletion layer width at the junction potential of 0.6 V is from 3.2 to 3.7 μm when the substrate, the resistivity thereof is from 60 to 80 Ωcm, described in connection with the IGBT according to the first embodiment is used. Since the gate electrodes on both sides of the mesa region are sandwiching the mesa region, depletion layers expand from both side faces of the mesa region. Therefore, if the mesa region width is from 6.4 to 7.4 μm, the mesa region can be depleted by a low voltage, as low as the pn-junction potential: In the case of the IGBT used for the breakdown voltage class of from 600 V to 3300 V, the silicon wafer, the resistance value r thereof is related with the breakdown voltage class V by the equation r=V/20, is typically used very often. When the relation expressed by the equation (1) is applied at the room temperature, FIG. 13, which relates the maximum mesa width with the square root of the breakdown voltage class, is obtained. The relation illustrated in FIG. 13 is expressed by the relational expression W<0.186V$^{1/2}$. For obtaining a high breakdown voltage, it is desirable to set the mesa within the range that satisfies the relational expression described above.

The present IGBTs have been described in connection with a silicon wafer formed of heavily doped p-type silicon substrate 1 and a lightly doped n-type drift layer 2. Alternatively, an n-type FZ wafer can be employed with no problem. The trench IGBT using the n-type FZ wafer can be manufactured in the following way. Trench MOS structures can be formed from one major surface of the n-type FZ wafer. Then, the n-type FZ wafer with the trench MOS structures formed therein can be polished by chemical mechanical polishing (CMP) from other major surface thereof. Finally, the p-type collector layer can be formed by injecting a p-type dopant from the polished major surface.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application No. 2005-019169, filed on 27 Jan. 2005. The disclosure of the priority application, in its entirety, including the drawings, claims, and the specification thereof, are incorporated herein by reference.

What is claimed is:

1. An insulated gate bipolar transistor device comprising:
   a semiconductor substrate having a first semiconductor layer of a first conductivity type and a second semiconductor layer of a second conductivity type, which is opposite of the first conductivity type, on a surface of the first semiconductor layer;
   stripe-shaped trenches formed in a surface of the second semiconductor layer;
   third semiconductor regions of the first conductivity type in the surface of the second semiconductor layer arranged between every other of the trenches along a direction perpendicular to a longitudinal direction of the trenches so that the third semiconductor regions are alternately arranged with surface regions of the second semiconductor layer existing between the trenches along the surface of the second semiconductor layer;
   at least one fourth semiconductor region of the second conductivity type selectively formed in at least one surface portion of the third semiconductor regions;
   a gate electrode in each of the trenches with a gate oxide film interposed between the gate electrode and the respective trench;
   an emitter electrode in direct contact with the third semiconductor regions and the fourth semiconductor regions;
   a collector electrode in contact with the first semiconductor layer; and
   an interlayer insulator film covering the surface regions of the second semiconductor layer to prevent the emitter electrode from contacting the surface regions of the second semiconductor layer.

2. The insulated gate bipolar transistor device according to claim 1, wherein a ratio of a sum of surface areas of the third semiconductor regions and the fourth semiconductor regions to a surface area of the first semiconductor layer is 80% or lower and 10% or higher.

3. The insulated gate bipolar transistor device according to claim 1, wherein the third semiconductor regions and the fourth semiconductor regions are connected electrically to each other through the emitter electrode.

4. The insulated gate bipolar transistor device according to claim 1, wherein the trenches are arranged at an equal interval and a width W of regions sandwiched between the trenches satisfies the following condition $W<0.186V^{1/2}$, where V represents the rated voltage of the insulated gate bipolar transistor device.

5. The insulated gate bipolar transistor device according to claim 1, wherein the third semiconductor regions are also alternately arranged with the surface regions of the second semiconductor layer between each adjacent pair of trenches along the longitudinal direction of the trenches so that the third semiconductor regions are aligned diagonally to form a checkered pattern with the surface regions of the second semiconductor layer.

6. The insulated gate bipolar transistor device according to claim 2, wherein the trenches are arranged at an equal interval and a width W of regions sandwiched between the trenches satisfies the following condition $W<0.186V^{1/2}$, where V represents the rated voltage of the insulated gate bipolar transistor device.

7. The insulated gate bipolar transistor device according to claim 2, wherein the third semiconductor regions and the fourth semiconductor regions are connected electrically to each other through the emitter electrode.

8. The insulated gate bipolar transistor device according to claim 3, wherein the trenches are arranged at an equal interval and a width W of regions sandwiched between the trenches satisfies the following condition $W<0.186V^{1/2}$, where V represents the rated voltage of the insulated gate bipolar transistor device.

9. The insulated gate bipolar transistor device according to claim 7, wherein the trenches are arranged at an equal interval and a width W of regions sandwiched between the trenches satisfies the following condition $W<0.186V^{1/2}$, where V represents the rated voltage of the insulated gate bipolar transistor device.

10. A method of manufacturing an insulated gate bipolar transistor device, comprising the steps of:

providing a semiconductor substrate having a first semiconductor layer of a first conductivity type and a second semiconductor layer of a second conductivity type, which is opposite of the first conductivity type, on a surface of the first semiconductor layer;

forming stripe-shaped trenches in a surface of the second semiconductor layer;

forming third semiconductor regions of the first conductivity type in the surface of the second semiconductor layer and arranged between every other of the trenches along a direction perpendicular to a longitudinal direction of the trenches so that the third semiconductor regions are alternately arranged with surface regions of the second semiconductor layer existing between the trenches along the surface of the second semiconductor layer;

selectively forming at least one fourth semiconductor region of the second conductivity type in at least one surface portion of each of the third semiconductor regions;

forming a gate electrode in each of the trenches with a gate oxide film interposed between the gate electrode and the respective trench;

forming an emitter electrode in direct contact with the third semiconductor regions and the fourth semiconductor regions;

forming a collector electrode in contact with the first semiconductor layer; and forming an interlayer insulator film covering the surface regions of the second semiconductor layer to prevent the emitter electrode from contacting the surface regions of the second semiconductor layer.

11. The method according to claim 10, wherein the third semiconductor regions are also alternately arranged with the surface regions of the second semiconductor layer between each adjacent pair of trenches along the longitudinal direction of the trenches so that the third semiconductor regions are aligned diagonally to form a checkered pattern with the surface regions of the second semiconductor layer.

* * * * *

UNITED STATES PATENT AND TRADEMARK OFFICE
CERTIFICATE OF CORRECTION

| | | |
|---|---|---|
| PATENT NO. | : 7,633,122 B2 | |
| APPLICATION NO. | : 11/226860 | |
| DATED | : December 15, 2009 | |
| INVENTOR(S) | : Masahito Otsuki | |

It is certified that error appears in the above-identified patent and that said Letters Patent is hereby corrected as shown below:

On the Title Page
Item (73) Titled "Assignee" this section has been omitted and should appear as follows:

--Fuji Electric Device Technology Co., Ltd. (JP)--

Item (74) Titled "Attorney, Agent, or Firm" this section has been omitted and should appear as follows:

--Rossi, Kimms & McDowell LLP--

Signed and Sealed this
Twenty-ninth Day of March, 2011

David J. Kappos
*Director of the United States Patent and Trademark Office*